United States Patent
Kasahara et al.

(10) Patent No.: US 7,514,852 B2
(45) Date of Patent: Apr. 7, 2009

(54) PIEZOOSCILLATOR

(75) Inventors: Kenji Kasahara, Sayama (JP); Takeshi Uchida, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 271 days.

(21) Appl. No.: 11/472,197

(22) Filed: Jun. 21, 2006

(65) Prior Publication Data

US 2006/0290239 A1    Dec. 28, 2006

(30) Foreign Application Priority Data

Jun. 24, 2005   (JP)   ............... 2005-185437

(51) Int. Cl.
*H01L 41/08* (2006.01)
(52) U.S. Cl. .................. 310/343; 310/344; 310/340
(58) Field of Classification Search ................ 310/343
See application file for complete search history.

(56) References Cited

U.S. PATENT DOCUMENTS

| | | | | |
|---|---|---|---|---|
| 3,431,392 A | * | 3/1969 | Garland et al. ............. | 219/210 |
| 6,133,674 A | * | 10/2000 | Fry ............................ | 310/343 |
| 7,378,781 B2 | * | 5/2008 | Vilander .................... | 310/343 |

OTHER PUBLICATIONS

Non-patent document 1 (Explanation and Application of Quartz Crystal Devices [Suisho Device no Kaisetsu to Oyo]: Mar. 2002, published by Quartz Crystal Industry Association of Japan (pp. 18 to 20) 6 pages.

* cited by examiner

*Primary Examiner*—Mark Budd
(74) *Attorney, Agent, or Firm*—Jordan and Hamburg LLP

(57) ABSTRACT

A piezooscillator having a piezoelectric vibrator and an oscillation circuit in a space surrounded by a substrate and a cover, which has a smaller size and height, and further, which can be assembled easily and suppress power consumption, is provided. The piezooscillator includes a recessed portion formed on the surface of the substrate; a supporting member supporting the piezoelectric vibrator while the piezoelectric vibrator is in a state partially or entirely accommodated in the recessed portion and floating from the substrate; a heating element provided on the surface of the piezoelectric vibrator; a temperature sensitive element provided in the space; and a temperature control unit provided in the space and controlling power supply to said heating element based on an output of the temperature sensitive element, in which, it is possible to reduce capacity of the space accommodating the piezoelectric vibrator and the heating element by eliminating the need of an additional substrate provided above the substrate as in conventional piezoelectric vibrators, so that the size and height of the piezooscillator can be reduced, in which assembling is eased, and power consumption can be reduced on the back of suppressed heat release to the substrate.

13 Claims, 15 Drawing Sheets

PIEZOOSCILLATOR

BACKGROUND OF THE INVENTION

1. Field of the Invention

The present invention relates to a piezooscillator provided with a piezoelectric vibrator and configured to stabilize frequency oscillated by the piezoelectric vibrator against a change in ambient temperature using a heating element.

2. Description of the Related Art

As an example of the piezooscillator provided with the piezoelectric vibrator, there is a quartz oscillator provided with a quartz vibrator, and as typical configurations to obtain frequency stability against the temperature of the crystal oscillator, there are known a TCXO (Temperature Compensated Crystal Oscillator) and an OCXO (Oven Controlled Crystal Oscillator) (Nonpatent document 1). The TCXO is configured to have a built-in temperature compensation circuit employing a temperature sensitive element so that the oscillation frequency is corrected based on the value of the temperature detected by the temperature sensitive element. This TCXO has advantages of lower power consumption as compared to the OCXO, and smaller size and weight in general. As compared to OCXO, however, the TCXO is easily affected by the ambient temperature and hence difficult to apply when high frequency stability is required.

Meanwhile, as for the OCXO, the quartz vibrator is enclosed in an oven, and the inside of the oven becomes a constant temperature by being warmed by the heating element such as a heater so that the ambient temperature of the quartz vibrator is kept constant. The description will be given of the configuration in more detail with reference to FIGS. 15A, 15B, 15C. In the drawings, "11" denotes a substrate that is fixed to a substrate 16 via support posts 15 being lead pins while it is in a floating state from the substrate 16. Although it is omitted to show in the drawings to avoid complication, the support posts 15 are connected to the substrate 11 and substrate 16 via solder or the like so that the substrate 11 and substrate 16 are electrically connected. On the substrate 11, a quartz vibrator 12, a heating element 13 and a temperature sensitive element 14 are disposed. In the drawings, "17" is a peripheral circuit including the oscillation circuit, a temperature control circuit and the like. On the substrate 16, a cover 18 is provided to cover the substrate 11, support posts 15 and the peripheral circuit 17, and a space 19 surrounded by the cover 18 and the substrate 16 is configured to be at a constant temperature when the quartz vibrator 12 oscillates. In FIG. 10C, "10" are electrodes provided on a rear surface of the substrate 16.

Note that, as described above, the substrate 11 on which the quartz vibrator 12, heating element 13 and so forth are disposed is provided in the floating state from another substrate 16, this is to reduce power consumption to keep the temperature of the space 19 by suppressing heat dissipation, in that when the substrate 16 is configured to have quartz vibrator 12 and heating element 13 directly disposed thereon, the heat from the heating element 13 is transmitted to the substrate 16 to easily be released outside the OCXO.

With the configuration as described above, the OCXOs are difficult to be affected by the ambient temperature and exhibit an advantage of higher frequency stability, so that they are being employed in mobile communication equipment, transmission communication equipment and so forth; however, in recent years, along with the downsizing of such equipment, the OCXOs are demanded to reduce their size and height. However, the OCXO of the configuration shown in FIG. 15 is configured such that the substrate 11 is floated above the substrate 16 via the support posts 15 and the quartz vibrator 12 is provided on the substrate 11. It is therefore difficult to realize the downsizing and height reduction of the OCXO and, therefore, the OCXO has a height, for example, of approximately 7 mm to 10 mm at minimum.

Further, in order to have the above-described configuration, when manufacturing the OCXO, it is required that the substrate 11 and the quartz vibrator 12 be electrically connected, and the substrate 11 and the substrate 16 be electrically connected. Accordingly, due to an addition of a soldering step or the like, the production process of the OCXO becomes complicated and production cost increase is caused, being problems. Further, the heat of the heating element 13 is released to the substrate 11, causing a problem of increasing power consumption to keep the quartz vibrator 12 be at a preset temperature. Therefore, improvements of these problems have been desired.

(Nonpatent document 1)

Suisho Device no Kaisetsu to Oyo (Description and Application of Quartz Crystal Devices), Quartz Crystal Industry Association of Japan, 18-20 p, March, 2002.

SUMMARY OF THE INVENTION

The present invention has been made under the circumstances as described above, and an object thereof is to provide a piezooscillator having a heating element that can be assembled easily and reduce power consumption by reducing size and height of the piezooscillator.

The piezooscillator according to the present invention is a piezooscillator with a piezoelectric vibrator and an oscillation circuit in a space surrounded by a substrate and a cover, including: a recessed portion formed on a surface of the substrate; a supporting member supporting the piezoelectric vibrator while the piezoelectric vibrator is in a state partially or entirely accommodated in the recessed portion and floating from the substrate; a heating element provided on a surface of the piezoelectric vibrator; a temperature sensitive element provided in the space; and a temperature control unit provided in the space and controlling power supply to the heating element based on an output of the temperature sensitive element.

The supporting member is, for example, an adhesive, and in that case, the adhesive is provided, for example, in the recessed portion. Further, the adhesive may be provided over the surface of the substrate and the surface of the piezoelectric vibrator. Furthermore, the supporting member is, for example, a lead member, the lead member being, for example, to connect an electrode provided in the piezoelectric vibrator and an electrode provided on the surface of the substrate. Furthermore, for instance, a part or all of the heating element and the temperature sensitive element may be built in an integrated circuit and the integrated circuit may be provided on the surface of the piezoelectric vibrator. In that case, for example, the oscillation circuit and the temperature control unit may also be built in the integrated circuit.

Further, a piezooscillator according to another invention is a piezooscillator having a piezoelectric vibrator and an oscillation circuit in a space surrounded by a substrate and a cover, including: an adhesive fixed to the substrate and supporting the piezoelectric vibrator while the piezoelectric vibrator is in a floating state from the substrate; a heating element provided on a surface of the piezoelectric vibrator; a temperature sensitive element provided in the space; and a temperature control unit provided in the space and controlling power supply to the heating element based on an output of the temperature sensitive element. A part or all of the heating element and the temperature sensitive element may be built in an integrated circuit and the integrated circuit may be provided on the surface of the piezoelectric vibrator. In that case, for example, the oscillation circuit and the temperature control unit may also be built in the integrated circuit.

Further, a piezooscillator according to still another invention is a piezooscillator having a piezoelectric vibrator and an oscillation circuit in a space surrounded by a substrate and a cover, including: a lead member fixed to the substrate and supporting the piezoelectric vibrator while the piezoelectric vibrator is in a floating state from the substrate; a heating element provided on a surface of the piezoelectric vibrator; a temperature sensitive element provided in the space; and a temperature control unit provided in the space and controlling power supply to the heating element based on an output of the temperature sensitive element. The lead member is, for example, to connect the electrode provided in the piezoelectric vibrator and the electrode provided on the surface of the substrate. Further, a part or all of the heating element and the temperature sensitive element may be built in an integrated circuit and the integrated circuit may be provided on the surface of the piezoelectric vibrator. In that case, for example, the oscillation circuit and the temperature control unit may also be built in the integrated circuit.

According to the piezooscillator of the present invention, the piezoelectric vibrator provided with the heating element on the surface thereof is accommodated partially or entirely in the recessed portion provided on the surface of the substrate and, at the same time, supported by the supporting member while it is in the floating state from the substrate. Therefore, the capacity of the space to accommodate the piezoelectric vibrator and the heating element can be reduced, and as a result, the size and height of the piezooscillator can be reduced. Further, since the heating element is provided on the surface of the piezoelectric vibrator, the heat of the heating element is prevented from being released to the substrate, in which the heating value required for the heating element to heat the space is suppressed, so that the power consumption can be reduced as a result thereof. Further, it is not configured to have another substrate floating above the substrate, eliminating a step of electrically connecting the substrates, so that the production process can be simplified.

According to the piezooscillator of another invention, the piezoelectric vibrator is floated from the substrate using the adhesive and the piezoelectric vibrator is provided with the heating element, eliminating the need of the support post to float the piezoelectric vibrator from the substrate. The piezoelectric vibrator is required to have a certain configuration to carry out its function, therefore, in the conventional piezooscillator, it is avoided to support the piezoelectric vibrator directly by the support post and therefore the piezoelectric vibrator is placed on the substrate formed to be supported by the support post, however, the support post is made unnecessary, so that the substrate is made unnecessary as well. Accordingly, the step of electrically connecting the substrates can be eliminated, so that the production process can be simplified. Further, the piezoelectric vibrator is made to float from the substrate using the adhesive, in which a step of connecting the substrate and the support post can be eliminated, so that the production process can be simplified further. Furthermore, the heating element is provided on the surface of the piezoelectric vibrator, thereby the heat of the heating element is prevented from being released to the substrate, in which the heating value required to warm the space accommodating the piezoelectric vibrator is suppressed, so that the power consumption can be reduced. Therefore, the capacity of the space to accommodate the piezoelectric vibrator can be reduced by that for a piece of substrate, so that the size and height of the piezooscillator can be reduced.

Further, according to the piezooscillator of still another invention, the piezoelectric vibrator is made to float from the substrate using a lead member and the piezoelectric vibrator is provided on the heating element. Accordingly, the support post to float the piezoelectric vibrator from the substrate is made unnecessary, and therefore the substrate supported by the support post is made unnecessary as well. Accordingly, the step of electrically connecting the substrates can be eliminated, so that the production process can be simplified as a result thereof. Further the piezoelectric vibrator is made to float from the substrate using the lead member, in which the piezoelectric vibrator and the substrate can be electrically connected via the lead member, allowing the number of components of the piezooscillator to be reduced as a result thereof, so that the production process of the piezooscillator can be reduced. Furthermore, the heating element is provided on the surface of the piezoelectric vibrator, thereby the heat of the heating element is prevented from being released to the substrate, in which the heating value required to warm the space accommodating the piezoelectric vibrator is suppressed, so that the power consumption can be reduced. Therefore, the capacity of the space to accommodate the piezoelectric vibrator can be reduced by that for a piece of substrate, so that the size and height of the piezooscillator can be reduced.

DETAILED DESCRIPTION OF THE PREFERRED EMBODIMENT(S)

Figure 1A:
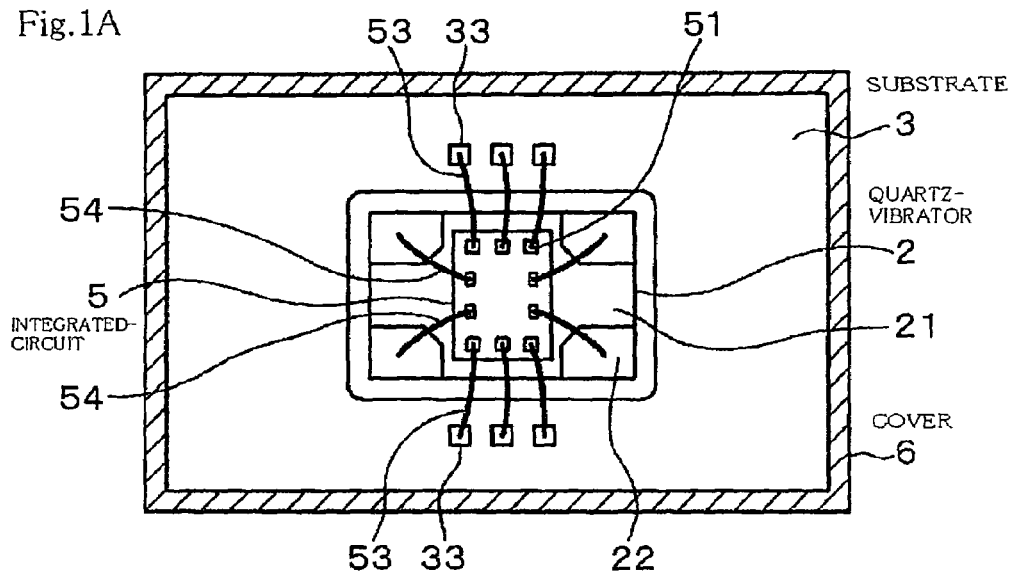
FIGS. 1A, 1B, 1C are views showing a configuration of a quartz oscillator according to an embodiment of the present invention.
Figure 1B:
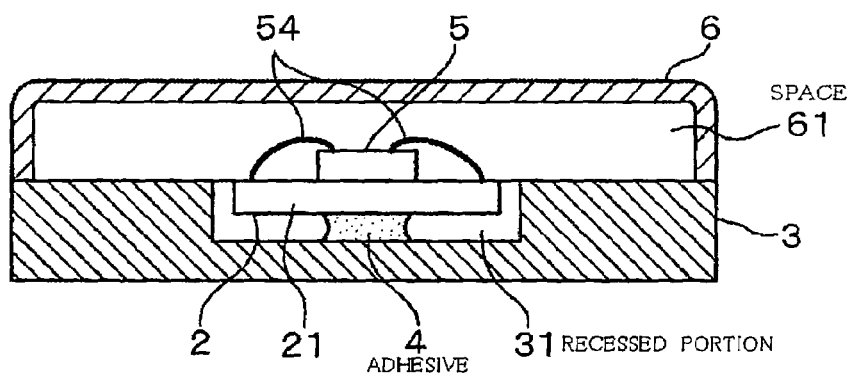
Figure 1C:
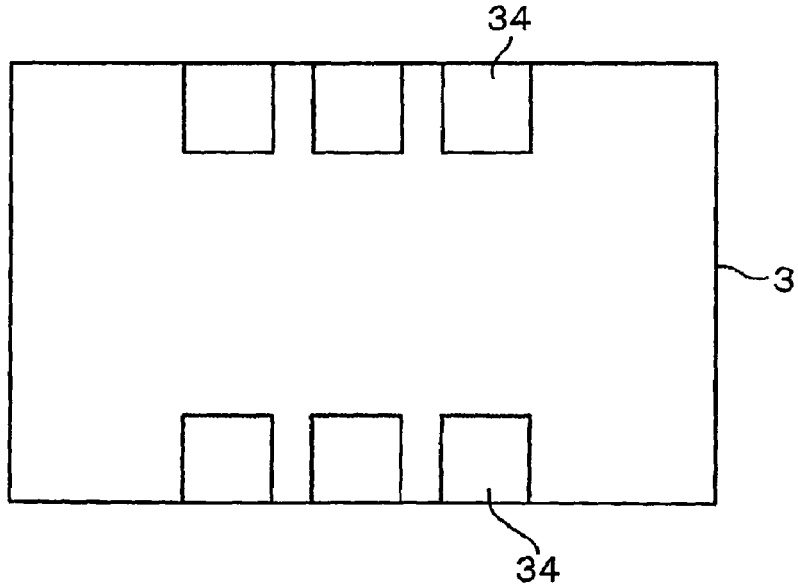

Hereinafter, as an example embodiment of a piezooscillator according to the present invention, a quartz oscillator provided with a quartz vibrator will be described with reference to the drawings. FIGS. 1A, 1B, 1C are views showing a sectional plane, a side section and a rear surface of the quartz oscillator, respectively. In the drawings, "2" denotes the quartz vibrator, "3" denotes a substrate, "4" denotes an adhesive, "5" denotes an integrated circuit and "6" denotes a cover, and these are components of the quartz oscillator.

Figure 2A:
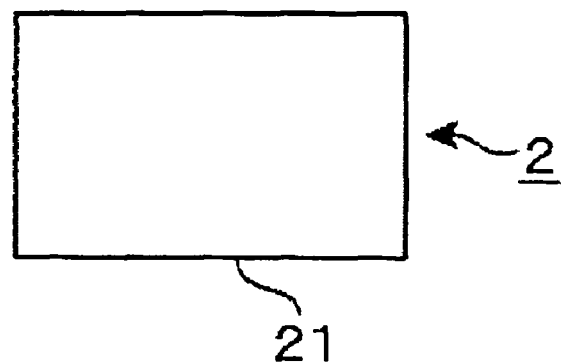
FIGS. 2A, 2B, 2C are explanatory views showing an example quartz vibrator used in the quartz oscillator.
Figure 2B:
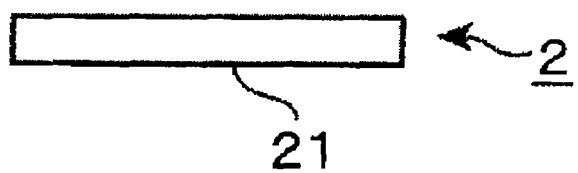
Figure 2C:
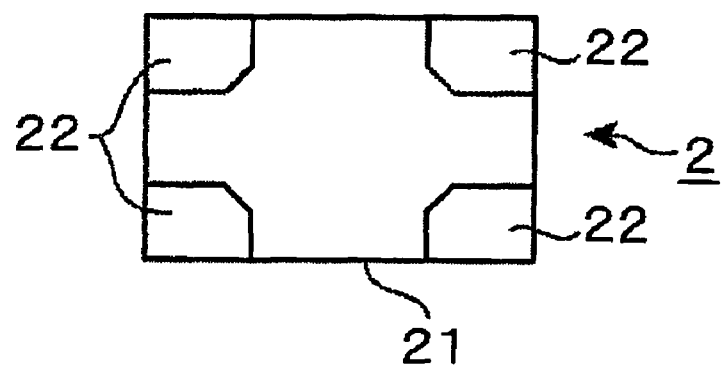

FIGS. 2A, 2B, 2C are views showing the quartz vibrator 2 being a piezoelectric vibrator, and in this example, a quartz crystal piece and a pair of exciting electrodes to excite the quartz crystal piece are enclosed in a card-type package 21. Electrodes 22 are provided, for example, at four corners on a surface of the package 21, and the respective electrodes 22 are electrically connected to the exciting electrodes respectively inside the package 21.

Back to FIG. 1, and the description will be given of the substrate 3. A recessed portion 31 to accommodate the quartz vibrator 2 is provided at a center portion of a surface of the substrate 3. An opening of the recessed portion 31 is larger than a surface of the quartz vibrator 2, and the depth of the recessed portion 31 is formed to be larger than the height of the quartz vibrator 2. Further, internal electrodes 33 electrically connected to electrodes 51 of the integrated circuit 5 are provided so as to surround the recessed portion 31. Note that "34" in FIG. 1C denotes external electrodes provided on a rear surface of the substrate 3 to connect the quartz oscillator to equipment on which the quartz oscillator is mounted.

The adhesive 4 is fixed, for example, to a center portion of the recessed portion 31. The quartz vibrator 2 is fixed to the substrate 3 via the adhesive 4 such that a rear surface of the quartz vibrator 2 and a plane portion in the recessed portion 31 face to each other, and the quartz vibrator 2 is accommodated in the recessed portion 31 in a manner floating from the substrate 3, namely in a state not directly contacting the substrate 3. In other words, the quartz vibrator 2 is supported by the adhesive 4 while it is in a floating state in the recessed portion 31.

Figure 3:
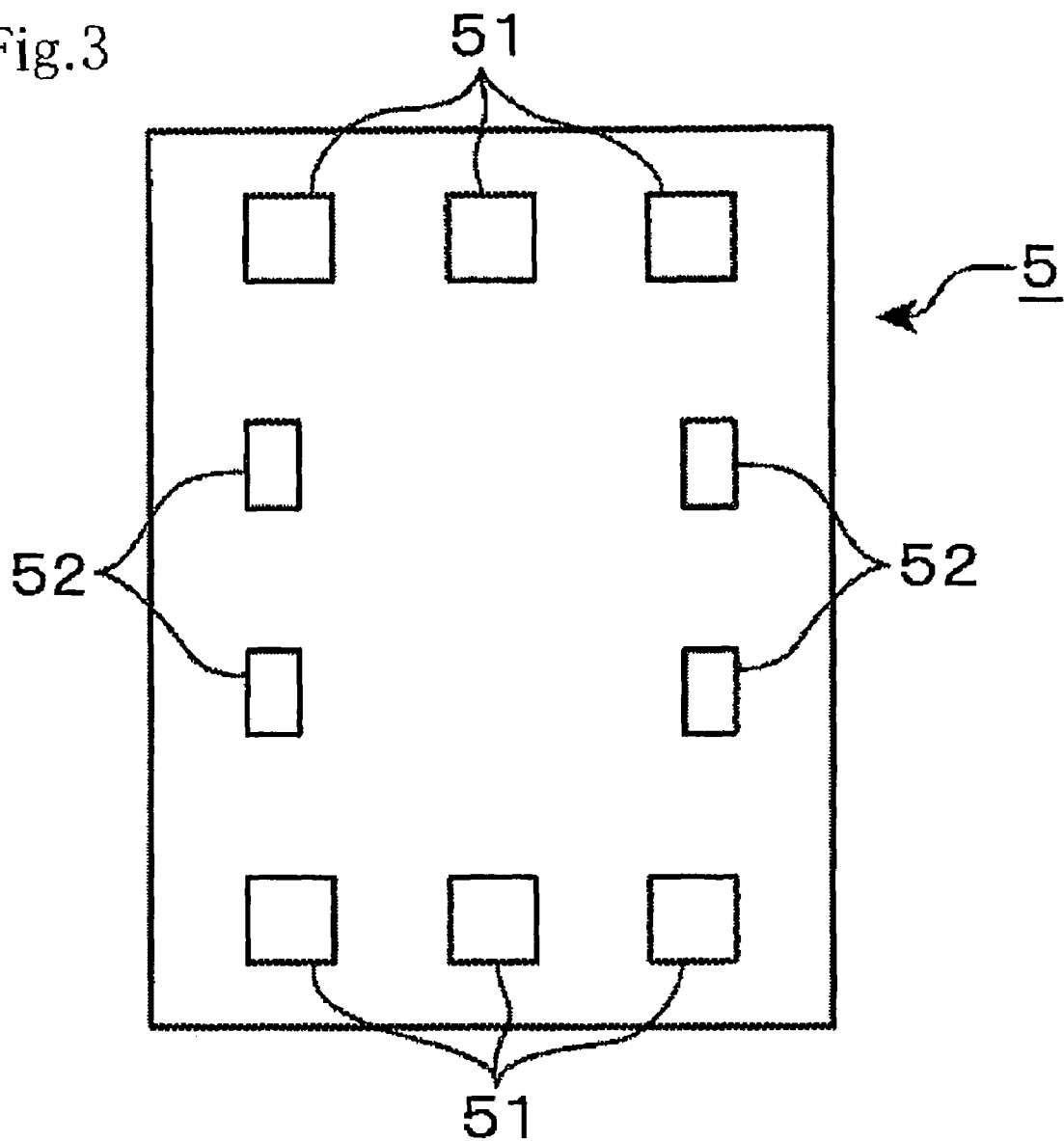
FIG. 3 is an explanatory view showing an example integrated circuit used in the quartz vibrator and the quartz oscillator.

The integrated circuit 5 is pasted at a center portion of the surface of the quartz vibrator 2. The description will be given with reference also to FIG. 3, the integrated circuit 5 includes an oscillation circuit, an amplifier circuit, a resistance heating element, a temperature sensitive element and a temperature control circuit to excite the quartz vibrator 2. The temperature control circuit controls the temperature of the quartz vibrator 2 by controlling power supply to the heating element based on an output of the temperature sensitive element. On a surface of the integrated circuit 5, for example, a plurality of electrodes 51 and electrodes 52 are provided, and the electrodes 51 and the internal electrodes 33 of the substrate 3, and the electrodes 52 and the electrodes 22 of the quartz vibrator 2 are electrically connected via bonding wires 53 and bonding wires 54, respectively. The bonding wire 54 is an input/output signal line of the quartz vibrator 2. In this example, the electrodes 51 and the electrodes 52 on the integrated circuit 5 are electrically connected, and thereby the quartz vibrator 2 and the substrate 3 are electrically connected via these electrodes 51, 52 and the bonding wires 53, 54. In the side section shown in FIG. 1B, the bonding wires 53 are omitted for the purpose of avoiding the drawing from complicating. Also, hereinafter, the bonding wires 53 are omitted in the drawings for the same purpose even when the side section of the other quartz oscillator is shown.

The cover 6 forming a thermostatic oven together with the substrate 3 is provided on the substrate 3 such that the respective electrodes on the quartz vibrator 2 and the substrate 3 and the integrated circuit 5 are covered thereby and a space 61 surrounded by the cover 6 and the substrate 3 is isolated from external space. Note that the isolation from the external space is not limited to make the space 61 be a closed space. The isolation from the external space means that, when the quartz vibrator 2 oscillates as will be described later and the resistance heating element under the control of the temperature control circuit of the integrated circuit 5 generates heat, the space 61 serves as a heat insulator and that the ambient temperature of the oscillation circuit of the integrated circuit 5 and the quartz vibrator 2 is kept at a constant temperature by receiving the heat of the resistance heating element.

In the quartz oscillator configured as described above, the quartz vibrator 2 oscillates by the oscillation circuit of the integrated circuit 5 and the oscillation output is amplified by the amplifier circuit of the integrated circuit 5 to be outputted from the quartz oscillator. When the temperature in the space 61 has a change during this oscillation, for example, by an external temperature change of the quartz oscillator, the temperature sensitive element of the integrated circuit 5 senses the temperature change to transmit a signal to the temperature control circuit. Then, the temperature control circuit controls the power supply to the resistance heating element so that the temperature change is compensated, thereby the frequency is stabilized.

According to the quartz oscillator of the present embodiment, inside the space 61 surrounded by the substrate 3 and the cover 6, the quartz vibrator 2 on which the integrated circuit 5 with the resistance heating element is pasted is accommodated in the recessed portion 31 provided in the substrate 3 via the adhesive 4 while it is supported in the floating state from the substrate 3. Accordingly, the capacity of the space 61 can be reduced, and as a result, the size and height of the quartz oscillator can be reduced. Further, since the integrated circuit 5 is provided on the surface of the quartz vibrator 2, the heat generated by the resistance heating element is prevented from being released to the substrate 3, thereby the heating value required for the resistance heating element to warm the space 61 is suppressed, so that the power consumption can be reduced as a result thereof. Further, the substrate 3 is not configured to have another substrate thereabove in the space 61, eliminating the step of electrically connecting the substrate 3 and another substrate, so that the production process can be simplified. Furthermore, the quartz vibrator 2 is supported by the adhesive 4 while it is in the floating state from the substrate 3, eliminating the need of providing a substrate to place the support post and the quartz vibrator 2 thereon, so that the need of connecting the support post and the substrate is eliminated. As a result, the production process of the quartz oscillator can be simplified.

In the present embodiment, the integrated circuit 5 integrating the oscillation circuit, the amplifier circuit, the resistance heating element, the temperature sensitive eminent and the temperature control unit is pasted on the surface of the quartz vibrator 2. Accordingly, the number of parts composing the quartz oscillator can be reduced, so that the production process can be simplified. Further, by integrating the components, the quartz oscillator can be downsized further. In addition to that, the integrated circuit 5 is provided in the same space 61 as of the quartz vibrator 2, so that the ambient temperature of these respective circuits included in the integrated circuit 5 and the temperature sensitive element is stabilized together with the ambient temperature of the quartz vibrator 2 when the quartz vibrator 2 oscillates. As a result, the frequency of the signal generated by the quartz oscillator is stabilized.

In the previously-described embodiment, the height of the quartz oscillator can be reduced even if the quartz oscillator is in the state of partially accommodated in the recessed portion 31 as long as the quartz vibrator 2 is supported while it is in the floating state from the substrate 3, so that the effect of the present invention can be attained. Accordingly, the recessed portion 31 is not necessary be formed to be larger than the height of the quartz vibrator 2.

Further, as previously described, the present quartz oscillator is acceptable as long as the ambient temperature of the oscillation circuit of the integrated circuit 5 and the quartz vibrator 2 is kept at a constant temperature when the quartz vibrator 2 oscillates. Accordingly, for example, it is acceptable that the recessed portion 31 is formed as a through hole. When the recessed portion 31 is the through hole, for example, it is designed that equipment to mount the quartz oscillator thereon includes a substrate, and the quartz oscillator is electrically connected to the equipment by being placed on the substrate, therefore, the recessed portion 31 (through hole) may be closed by the substrate as long as the connection is established.

Figure 4A:
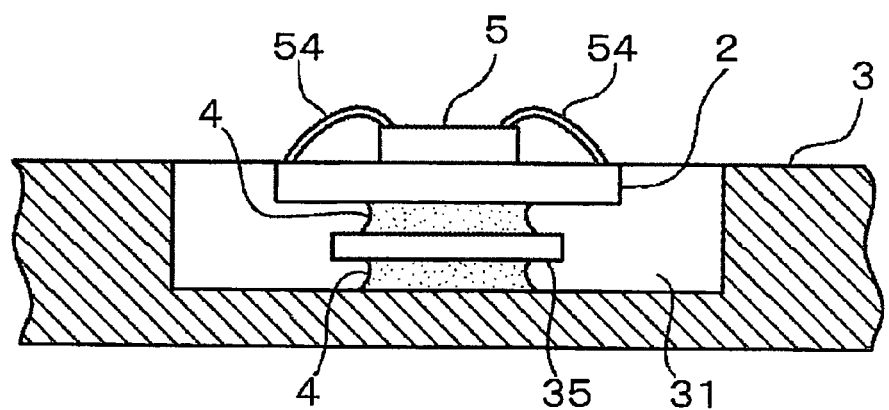
FIGS. 4A, 4B are side views of a longitudinal section showing a configuration of a quartz oscillator according to another embodiment of the present invention.

Incidentally, in the previously-described embodiment, it is acceptable that the quartz vibrator 2 is accommodated in the recessed portion 31 without directly contacting the substrate 3. As shown in FIG. 4A, as an example, a spacer 35 fixed to the recessed portion 31 via the adhesive 4 is provided inside the recessed portion 31 and the adhesive 4 is provided further on the spacer 35. Then, the quartz vibrator 2 may be supported while it is in the floating state from the substrate 3 via the adhesive 4 on the spacer 35.

Figure 4B:
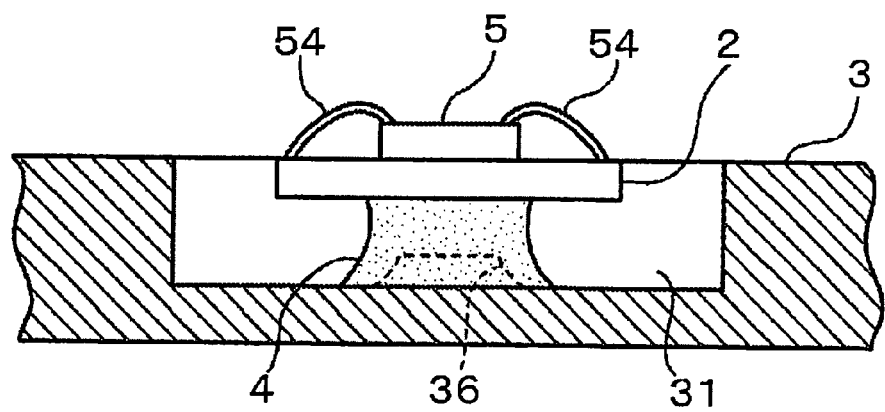

Also, for example, as shown in FIG. 4B, a protrusion 36 is provided at the center portion of the recessed portion 31 and the adhesive 4 is supplied to cover the protrusion 36. Then, the quartz vibrator 2 may be fixed above the protrusion 36 via the adhesive 4.

Figure 5A:
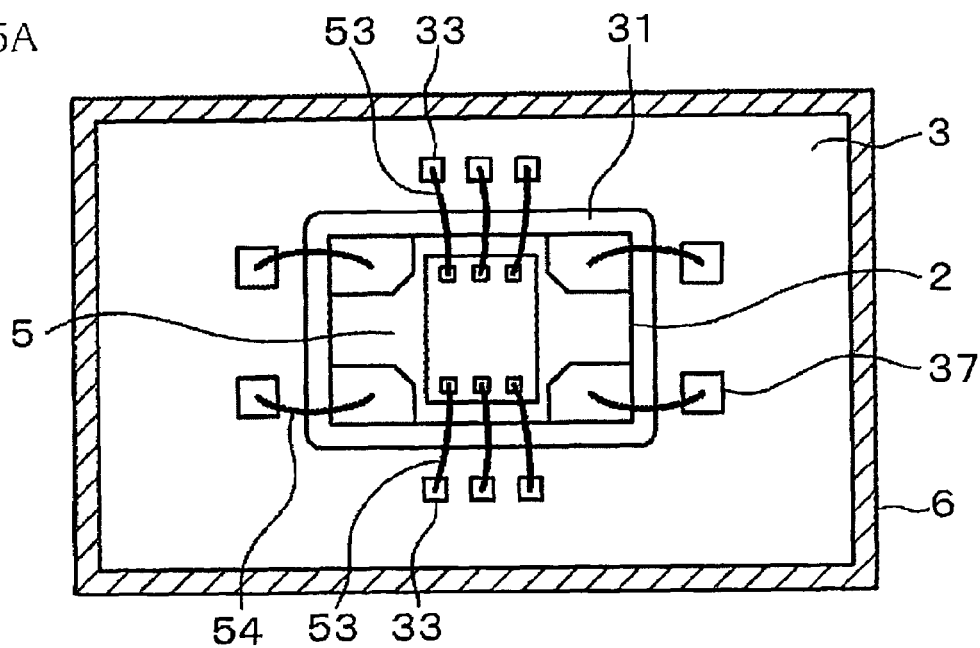
FIGS. 5A, 5B are explanatory views showing a configuration of a quartz oscillator according to still another embodiment of the present invention.
Figure 5B:
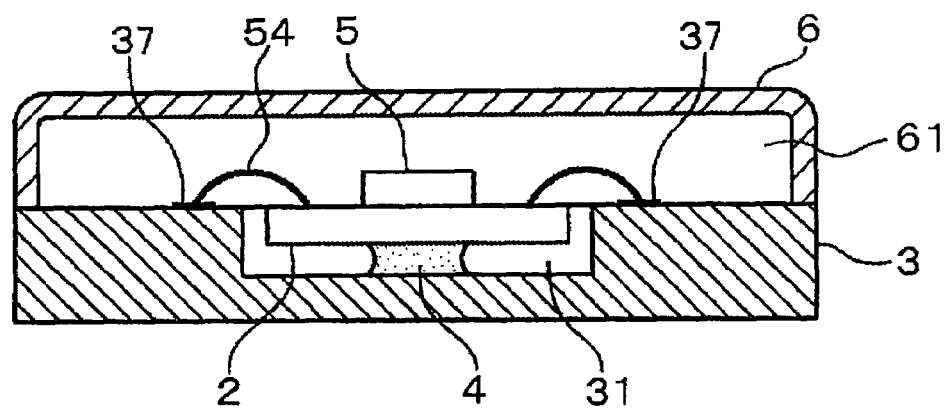

In the quartz oscillator shown in FIG. 1, it is configured that the quartz vibrator 2 and the substrate 3 are electrically connected via the electrodes 51, 52 and the bonding wires 53, 54, so that the step of electrically connecting the substrate 3 and the 22 is eliminated. Further, as shown in FIGS. 5A and 5B, as an example, it is possible to electrically connect the quartz vibrator 2 and the substrate 3, for example, by providing electrodes 37 around the recessed portion 31 of the substrate 3 and connecting the electrodes 37 and the electrodes 22 of the quartz vibrator 2 by the bonding wires 54 instead of providing the electrodes 52 in the integrated circuit 5. Note that, the quartz oscillator shown in FIG. 5 is different from the quartz oscillator shown in FIG. 1 in that the quartz vibrator 2 and the integrated circuit 5 are connected via the internal electrodes 33, 37 on the substrate 3 side and the bonding wires 53, 54, whereas, other than this difference, the quartz oscillator shown in FIG. 5 has the same configuration as of the quartz oscillator shown in FIG. 1.

Figure 6A:
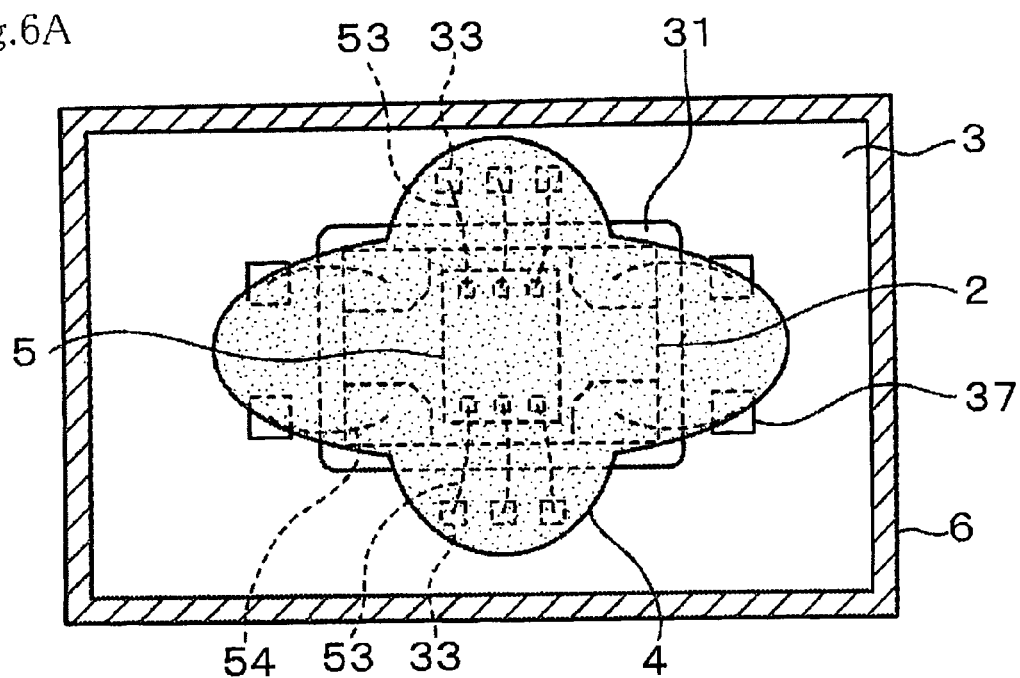
FIGS. 6A, 6B are explanatory views showing a configuration of a quartz oscillator according to still another embodiment of the present invention.
Figure 6B:
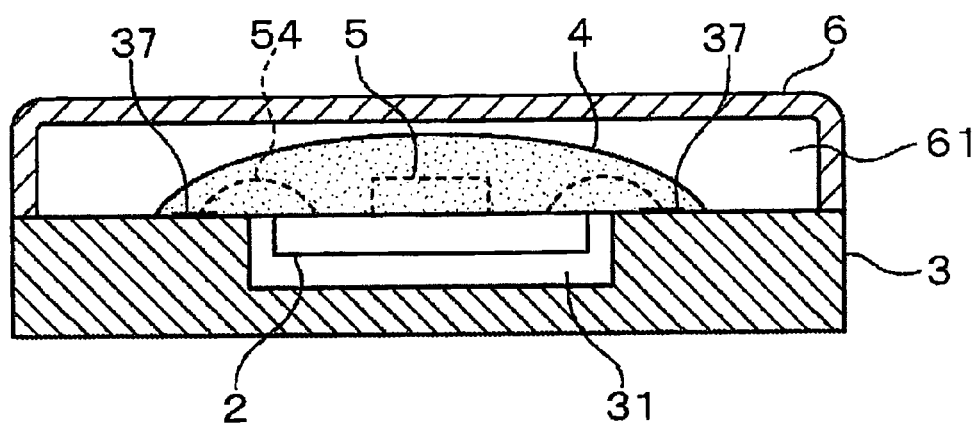

Meanwhile, the adhesive 4 may be supplied in a manner, for example, shown in FIGS. 6A and 6B in addition to that the adhesive 4 is provided between the quartz vibrator 2 and the plane portion of the recessed portion 31 as previously described. In the drawings, the adhesive 4 is provided on the surface of the quartz vibrator 2 such that it forms, for example, a dome with the end portions thereof covering the circumstance of the recessed portion 31, the quartz vibrator 2 is thereby supported while it is in the floating state from the substrate 3.

Figure 7A:
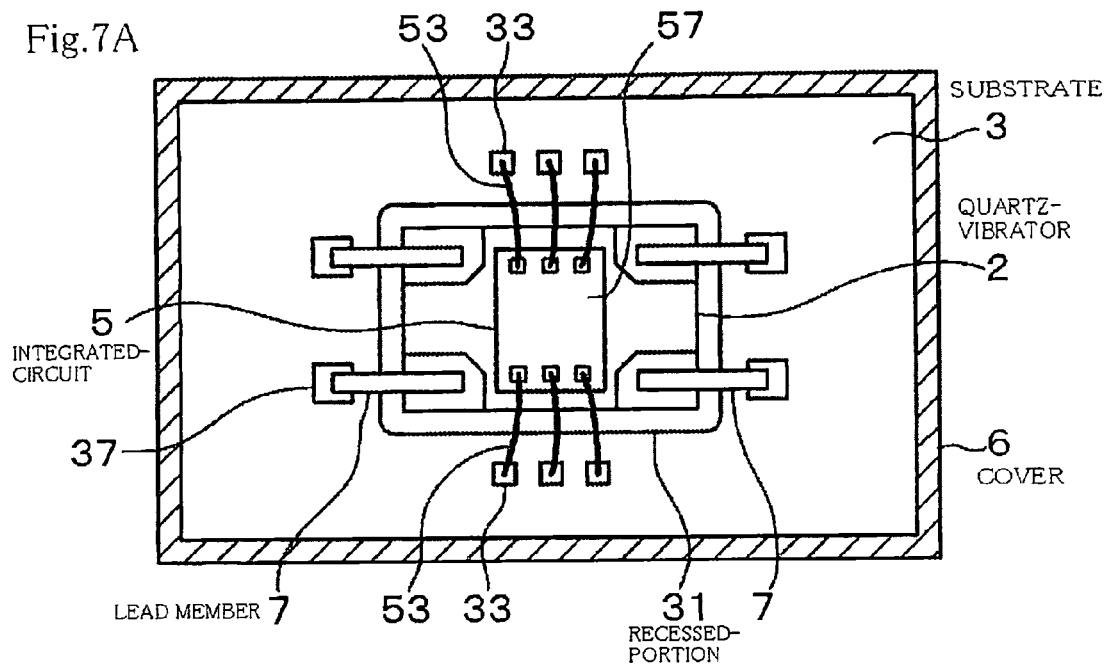
FIGS. 7A, 7B are explanatory views showing a configuration of a quartz oscillator according to still another embodiment of the present invention.
Figure 7B:
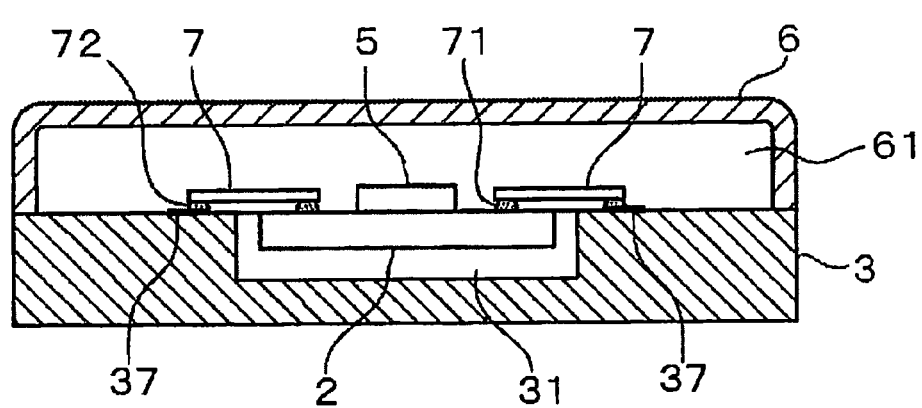
Figure 8A:
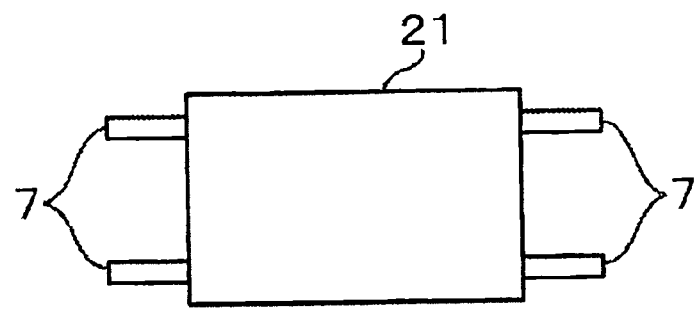
FIGS. 8A, 8B, 8C are explanatory views showing an example configuration of a quartz vibrator and lead members used in the quartz oscillator.
Figure 8B:
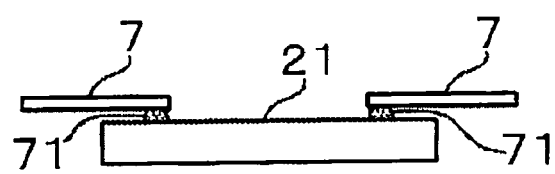
Figure 8C:
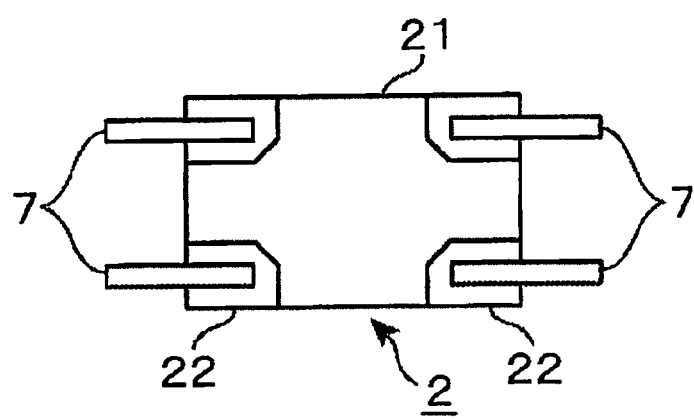

Further, in the previously described embodiment, the support member is not limited to the adhesive 4, and as in the quartz oscillator shown in FIGS. 7A and 7B, for example, a flat lead member 7 being an input/output signal line of the quartz vibrator 2 may be used. As a material of the flat lead member 7, for example, Kovar having a lower thermal conductivity is used. As shown also in FIGS. 8A, 8B, 8C, for example, each of the four edges of the flat lead members 7 is fixed to the electrode 22 of the quartz vibrator 2 via, for example, a silver blazing alloy 71. While each of the other edges of the lead members 7 is fixed to the electrode 37 on the substrate side via a silver blazing alloy 72. Since it is thus fixed, the electrodes 37 and the electrodes 22 of the quartz vibrator 2 are electrically connected, and at the same time, the quartz vibrator 2 is accommodated in the recessed portion 31 while it is in the state in which the rear surface thereof and the plane portion of the recessed portion 31 facing to each other, namely in the floating state from the substrate 3. Specifically, the quartz vibrator 2 is supported by the lead members 7 while it is in the floating state in the recessed portion 31 and thereby accommodated in the recessed portion 31 without directly contacting the substrate 3.

Note that, as to the sizes of the respective portions of the quartz oscillator in FIG. 7, for example, the thickness (height) of the substrate 3 is approximately 2 mm and the height of the cover 6 is approximately 2.5 mm. In addition, the height of the quartz oscillator is, for example, approximately 4.5 mm.

The configuration of the other components of the quartz oscillator shown in FIG. 7 is the same as of the components of the quartz oscillator shown in FIG. 5. When the lead members 7 is used as a supporting member as described above, it is needless to electrically connect the electrodes 51 of the integrated circuit 5 and the internal electrodes 33 of the substrate 3, for example, by the bonding wires as an additional step, reducing the number of components of the quartz oscillator, so that the production process can be simplified.

Figure 9A:
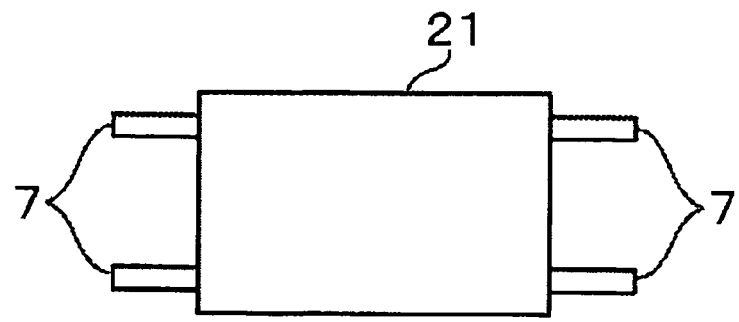
FIGS. 9A, 9B, 9C are explanatory views showing another example configuration of the quartz vibrator and the lead members used in the quartz oscillator.
Figure 9B:
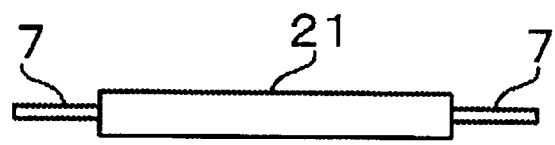
Figure 9C:
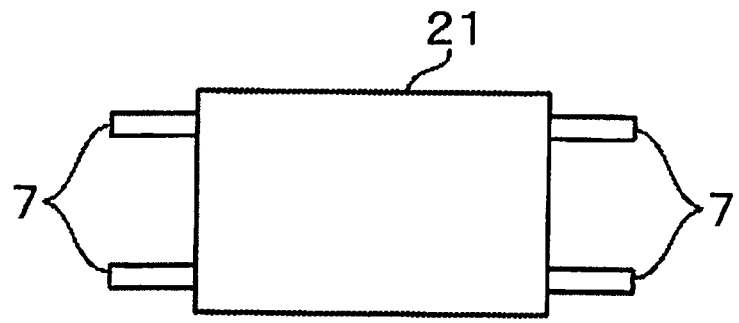

In the quartz oscillator shown in FIG. 7, the configuration of the quartz vibrator 2 and the lead members 7 is not limited to the above, and, for example, the lead members 7 and the quartz vibrator 2 can be formed as a unit. Specifically, for example, as shown in FIGS. 9A, 9B, 9C, a configuration in which the lead member 7 with one edge thereof being electrically connected to the excitation electrode of the quartz vibrator 2 inside the card-type package 21 and the other edge thereof being passing through and protruding from a side surface of the card-type package 21 is used may be adopted without providing the electrode on the surface of the package 21 of the quartz vibrator 2.

Figure 10A:
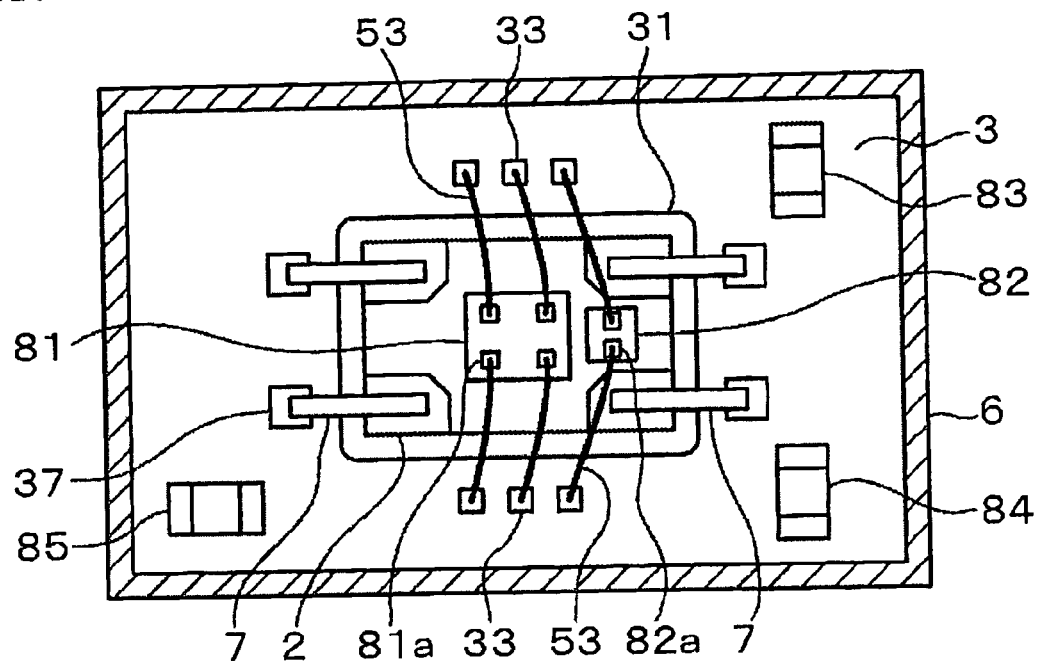
FIGS. 10A, 10B are explanatory views showing a configuration of a quartz oscillator according to still another embodiment of the present invention.
Figure 10B:
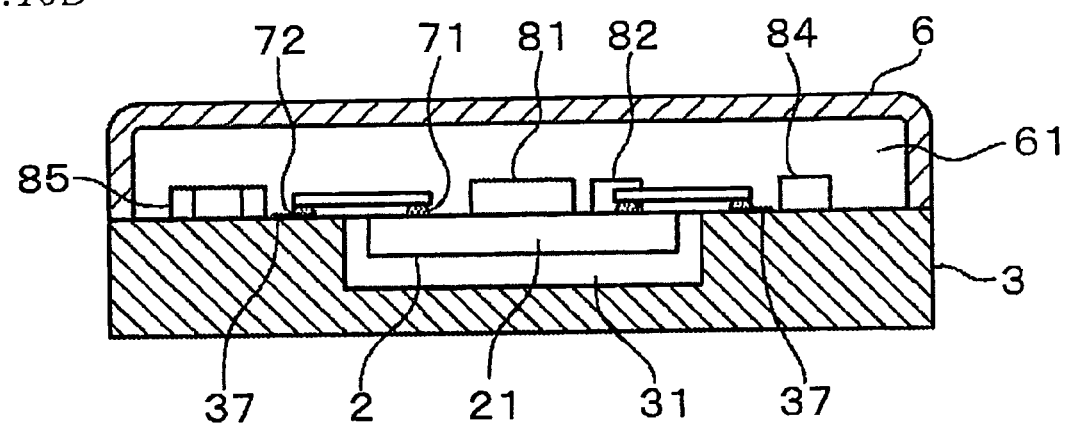

Further, in the previously-described embodiment, the oscillation circuit, the amplifier circuit, the resistance heating element, the temperature sensitive element and the temperature control circuit may not integrated and built into the integrated circuit 5. In one example, the quartz oscillator shown in FIGS. 10A and 10B is configured such that a resistance heating element 81 and a temperature sensitive element 82 are provided on the surface of the quartz vibrator 2 and an oscillation circuit 83, an amplifier circuit 84 and a temperature control circuit 85 are provided on the substrate 3 without providing the integrated circuit 5 on the surface of the quartz vibrator 2. Note that "81*a*" and "82*a*" in FIG. 10B denote electrodes provided in the resistance heating element 81 and the temperature sensitive element 82, respectively. These electrodes 81a, 82a are electrically connected to the internal electrodes 33 on the substrate 3 side via the bonding wires 53.

As to the sizes of the respective portions of the quartz oscillator in FIG. 10, for example, the thickness (height) of the substrate 3 is approximately 2 mm and the height of the cover 6 is approximately 2.5 mm. The heights of the respective circuits, the temperature sensitive element 82 and the resistance heating element 81 are, for example, 1.5 mm or below, respectively. In addition, the height of the quartz oscillator is, for example, approximately 4.5 mm.

Note that, in the case of the quartz oscillator shown in FIG. 10, the temperature sensitive element 82 may be provided on the substrate 3 as well instead of being provided on the quartz vibrator 2. Further, the quartz oscillator is designed to improve the stability of the frequency of the signal generated by the quartz oscillator by stabilizing the ambient temperature of the respective circuits and the temperature sensitive element 82 by configuring such that the respective circuits and the temperature sensitive element 82 are provided in the thermostatic oven (space 61). Note that, for example, a configuration in which the oscillation circuit 83, the amplifier circuit 84 and the temperature control circuit 85 are provided outside the cover 6 is also acceptable and in which the capacity of the space 61 can be reduced. Accordingly, it is possible to suppress the heating value required for the resistance heating element 81 to warm the space 61, so that the power consumption can be reduced.

Figure 11A:
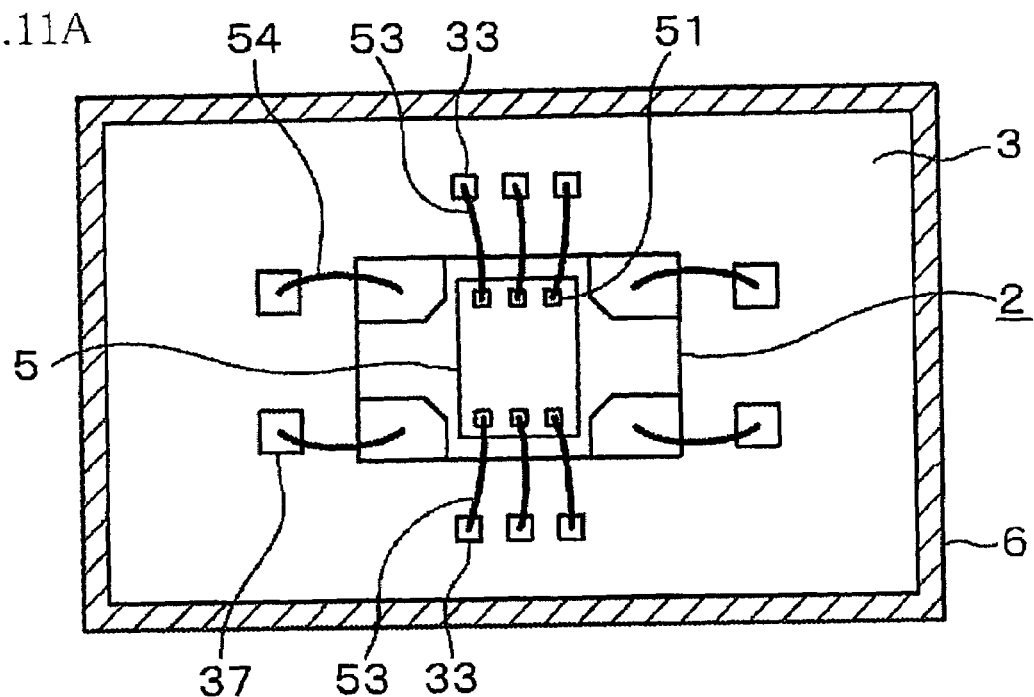
FIGS. 11A, 11B are explanatory views showing a configuration of a quartz oscillator according to still another embodiment of the present invention.
Figure 11B:
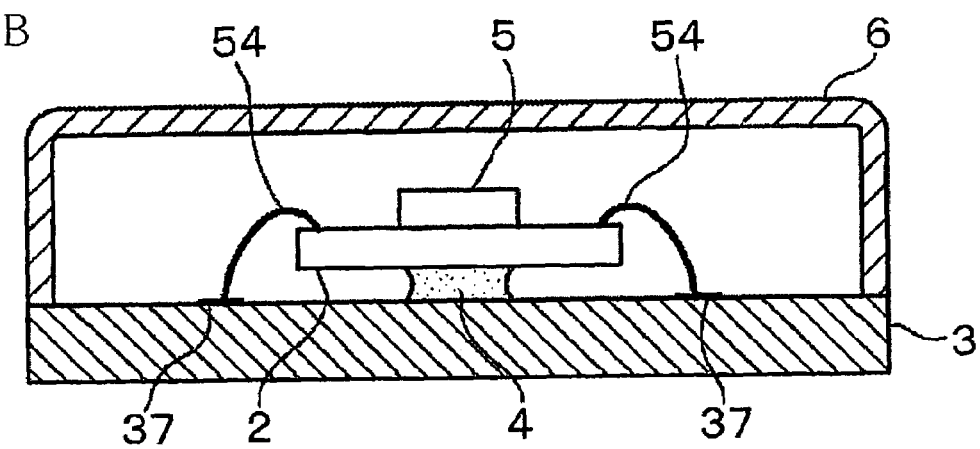

Subsequently, the description will be given of another embodiment with reference to FIGS. 11A and 11B. FIG. 11 are views showing an example quartz oscillator as in the previously-described embodiment, whereas, differently from the previously-described embodiment, no recessed portion 31 is provided in the substrate 3. The quartz vibrator 2 is the same as used in the embodiment firstly described, and, for example, the adhesive 4 being the supporting post is provided at a center portion of the substrate 3 and the quartz vibrator 2 is fixed to the substrate 3 via the adhesive 4, so that the adhesive 4 holds the quartz vibrator 2. The quartz vibrator 2 is thereby provided above the substrate 3 in the floating state from the substrate 3, namely in the state not directly contacting the substrate 3. The configuration of the other components of the quartz oscillator shown in FIG. 11 is the same as of the components of the quartz oscillator shown in FIG. 5.

As to the sizes of the respective portions of the quartz oscillator in FIG. 11, for example, the thickness (height) of the substrate 2 is, for example, approximately 1 mm and the height of the cover 6 is approximately 3.5 mm. The heights of the respective circuits, the temperature sensitive element 82 and the resistance heating element 81 are, for example, 2.5 mm or below, respectively. Further, the height of the quartz oscillator is, for example, approximately 4.5 mm.

According to the quartz oscillator in FIG. 11, the quartz vibrator 2 is made to float from the substrate 3 using the adhesive 4 and provided with the integrated circuit 5 having the resistance heating element. Therefore, it is needless to support another substrate above the substrate 3, eliminating the step of connecting the substrate 3 and another substrate, so that the production process can be simplified. Further, the integrated circuit 5 is pasted to the quartz vibrator 2, so that the heat generated by the resistance heating element of the integrated circuit 5 is prevented from being released to the substrate 3. Accordingly, it is possible to suppress the heating value of the resistance heating element required to warm the space 61, so that the power consumption can be reduced. Further, the capacity of the space 61 accommodating the quartz vibrator 2 can be reduced by that of a piece of substrate, and, as a result, the size and height of the quartz oscillator can be reduced.

Figure 12A:
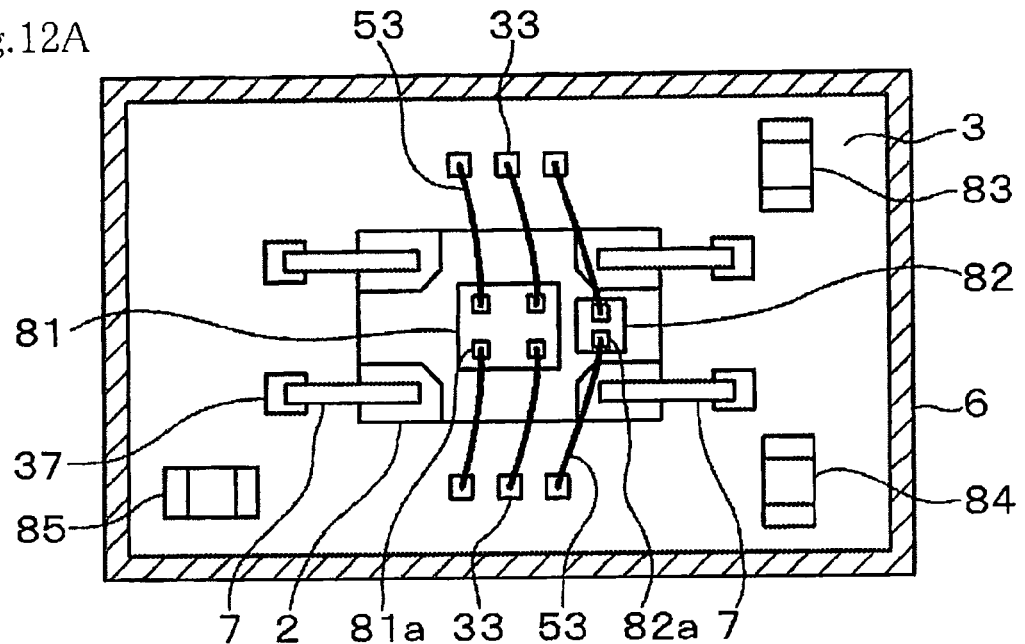
FIGS. 12A, 12B are explanatory views showing a configuration of a quartz oscillator according to still another embodiment of the present invention.
Figure 12B:
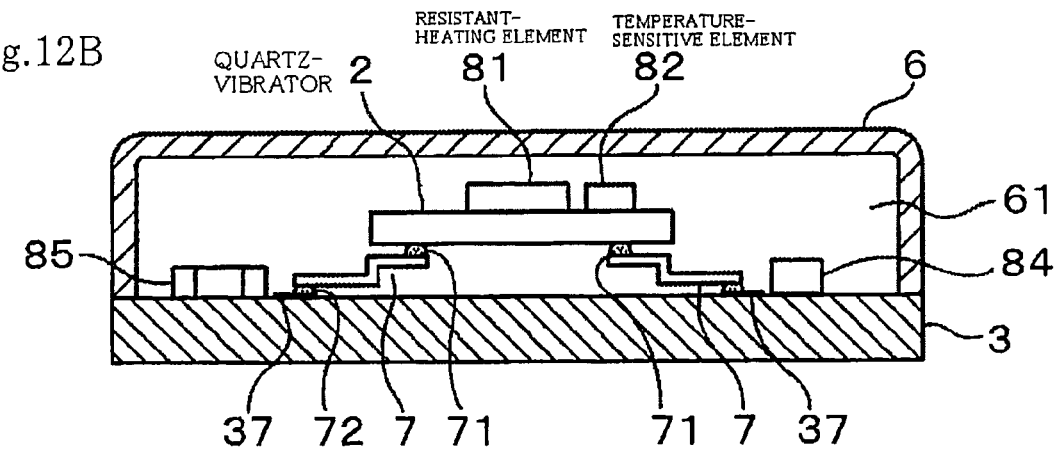
Figure 13A:
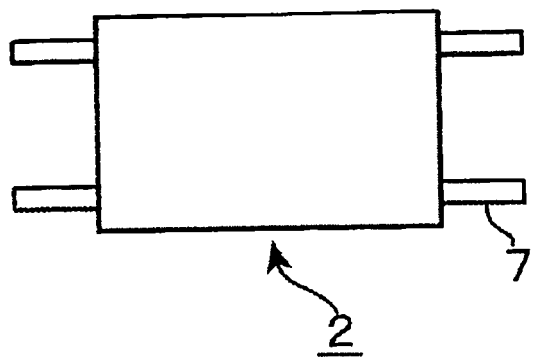
FIGS. 13A, 13B, 13C are explanatory views showing an example configuration of a quartz vibrator and lead members used in the quartz oscillator.
Figure 13B:
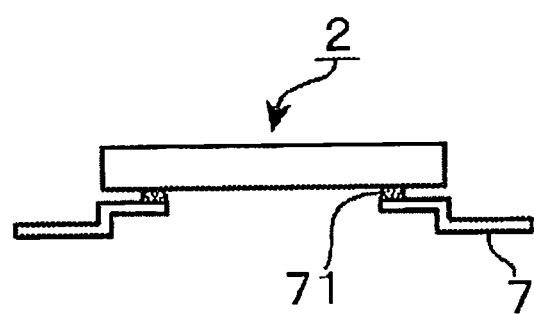
Figure 13C:
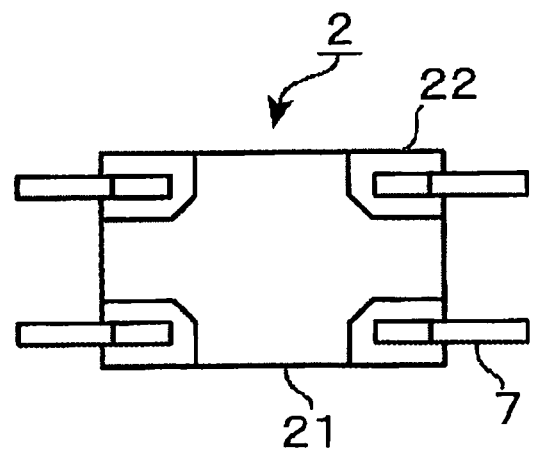

Note that, in the quartz oscillator shown in FIG. 11, the supporting member is not limited the adhesive 4. For instance, the quartz vibrator 2 may be provided above the substrate 3 in the floating state from the substrate 3, namely, in the state not contacting the substrate 3 using the lead members 7, as shown in FIGS. 12A and 12B. The lead member 7 in this example is formed such that an elongated plate are bent orthogonally inside and outside twice in the middle portions thereof so that both the end portions of the elongated plate are formed to have a step and be in parallel to each other, respectively, as shown in FIGS. 13A, 13B, 13C. The one edge of the respective lead members 7 is fixed to the electrode 22 on the rear side of the quartz vibrator 2, for example, via the silver blazing alloy 71, and the other edge is fixed to the electrodes 37 on the surface of the substrate 3 via the silver blazing alloy 72, in which the lead members 7 hold the quartz vibrator 2, so that the quartz vibrator 2 is fixed to the substrate 3 in the floating state from the substrate 3. Note that the other components of the quartz oscillator shown in FIG. 12 are configured in the same manner as in the quartz oscillator shown in FIG. 10.

Figure 14A:
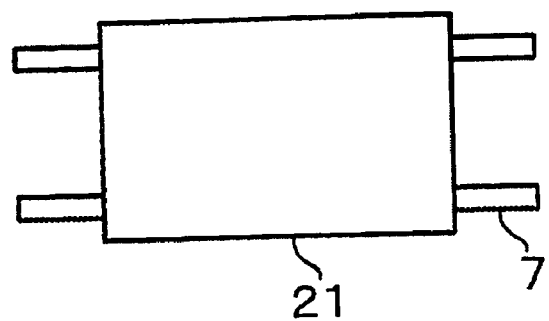
FIGS. 14A, 14B, 14C are explanatory views showing another example configuration of the quartz vibrator and the lead members used in the quartz oscillator.
Figure 14B:
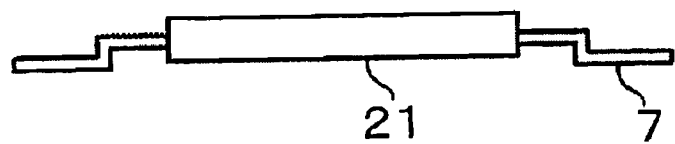
Figure 14C:
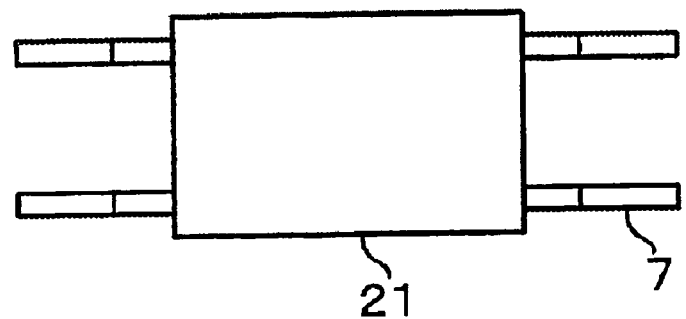
Figure 15A:
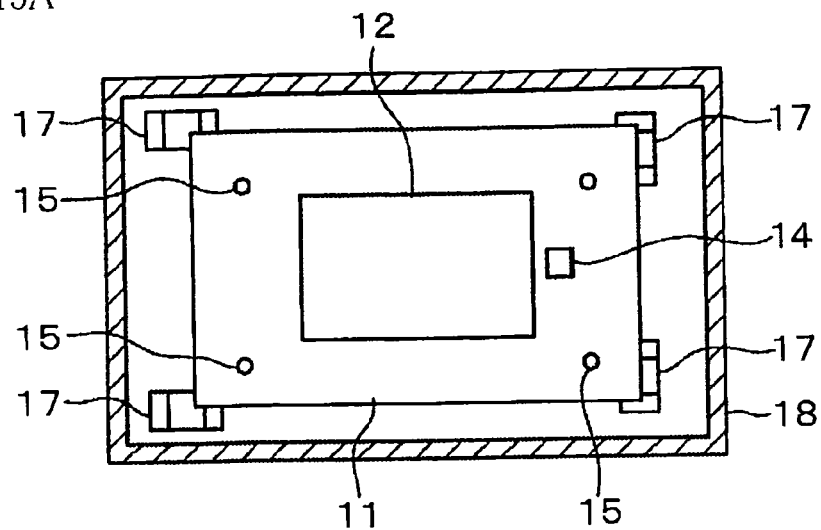
FIGS. 15A, 15B, 15C are explanatory views showing a configuration of a conventionally-used quartz oscillator.
Figure 15B:
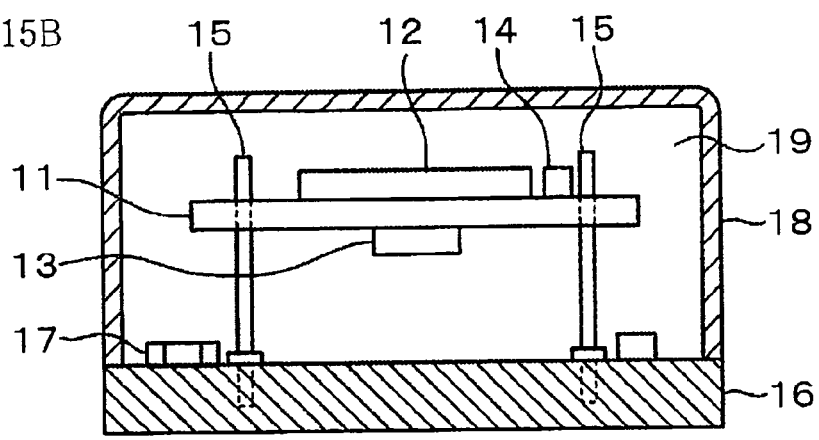
Figure 15C:
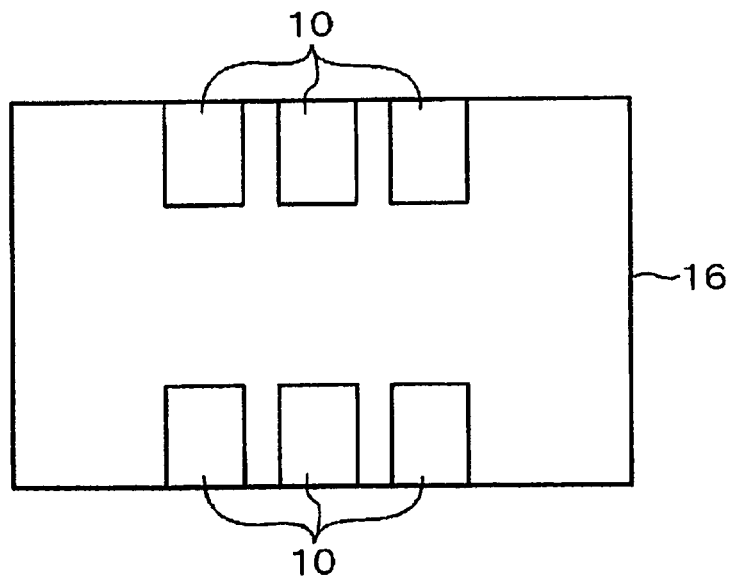

Similarly, in the quartz oscillator shown in FIG. 12, the lead members 7 and the quartz vibrator 2 formed as a unit may be used. For instance, as shown in FIGS. 14A, 14B, 14C, the four lead members 7 pass through and protrude from the side surfaces of the package 21 and, further, the respective lead members 7 are bent downward at the outside of the package 21. The end portions of the respective lead members 7 are structured, for example, to be bent externally at a position below the under surface of the package 21.

What is claimed is:

1. A piezooscillator device, comprising:
   a substrate;
   a cover defining a concavity;
   a thermostatic oven formed by said cover being connected to said substrate to define an interior space in the concavity which is isolated from atmosphere outside said cover and said substrate, said substrate having a first substrate surface exposed to said interior space and a second substrate surface external to said interior space;
   a package containing a piezoelectric vibrator, said package having a package electrode connected to an exciting electrode on the piezoelectric element;
   a recessed portion formed in the first substrate surface of said substrate and communicating with said interior space;
   a supporting member supporting said package such that said package is in a state partially or entirely accommodated in said recessed portion and separated from said substrate;
   a heating element provided on a surface of said package;
   a temperature sensitive element provided in the interior space; and
   a temperature control unit provided in the interior space and controlling power supply to said heating element based on an output of said temperature sensitive element; and
   an external electrode disposed on said second substrate surface and providing external connection to said piezoelectric vibrator.

2. The piezooscillator device according to claim 1, wherein said supporting member is an adhesive.

3. The piezooscillator device according to claim 2, wherein the adhesive is provided in said recessed portion.

4. The piezooscillator device according to claim 2, wherein the adhesive is provided over the first substrate surface of said substrate and a surface of said package.

5. The piezooscillator device according to claim 1, wherein said supporting member is a lead member.

6. The piezooscillator device according to claim 5, wherein the first substrate surface has an electrode connected to the lead member and the lead member is connected to said package electrode.

7. The piezooscillator device according to claim 1, wherein at least one of said heating element and said temperature sensitive element are built in an integrated circuit and the integrated circuit is provided on the surface of said package.

8. The piezooscillator device according to claim 7, wherein said temperature control unit is also built in the integrated circuit.

9. The piezooscillator device according to claim 7, wherein all of said heating element, said temperature sensitive element, and said temperature control unit are built in the integrated circuit disposed on the surface of said package.

10. The piezooscillator device according to claim 1, wherein an oscillation circuit is provided in said interior space and interconnected with said package electrode.

11. The piezooscillator device according to claim 10, wherein at least one of said heating element and said temperature sensitive element are built in an integrated circuit and the integrated circuit is provided on the surface of said package.

12. The piezooscillator device according to claim 11, wherein said oscillation circuit and said temperature control unit are also built in the integrated circuit.

13. The piezooscillator device according to claim 11, wherein all of said heating element, said temperature sensitive element, said oscillation circuit and said temperature control unit are built in the integrated circuit disposed on the surface of said package.

* * * * *